(12) United States Patent
Lee et al.

(10) Patent No.: US 11,915,931 B2
(45) Date of Patent: Feb. 27, 2024

(54) EXTREME ULTRAVIOLET LITHOGRAPHY PATTERNING METHOD

(71) Applicant: Tokyo Electron Limited, Tokyo (JP)

(72) Inventors: Choong-man Lee, Nirasaki (JP); Soo Doo Chae, Cohoes, NY (US); Angelique Raley, Albany, NY (US); Qiaowei Lou, Albany, NY (US); Toshio Hasegawa, Nirasaki (JP); Yoshihiro Kato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 181 days.

(21) Appl. No.: 17/406,612

(22) Filed: Aug. 19, 2021

(65) Prior Publication Data

US 2023/0054125 A1 Feb. 23, 2023

(51) Int. Cl.
*H01L 21/033* (2006.01)
*H01L 21/311* (2006.01)
*H01L 21/027* (2006.01)

(52) U.S. Cl.
CPC ...... *H01L 21/0337* (2013.01); *H01L 21/0274* (2013.01); *H01L 21/0332* (2013.01); *H01L 21/31144* (2013.01)

(58) Field of Classification Search
CPC ............ H01L 21/0274; H01L 21/0337; H01L 21/0332; H01L 21/31144; H01L 21/0231; H01L 21/02348
See application file for complete search history.

(56) References Cited

U.S. PATENT DOCUMENTS

| | | | |
|---|---|---|---|
| 6,730,458 B1* | 5/2004 | Kim | G03F 7/40 430/311 |
| 2011/0163420 A1* | 7/2011 | Valdivia | H01L 21/0338 257/E29.022 |
| 2014/0134848 A1 | 5/2014 | Hisamatsu | |
| 2015/0132965 A1* | 5/2015 | deVilliers | H01L 21/0337 438/703 |
| 2016/0154306 A1 | 6/2016 | Park | |
| 2016/0268176 A1* | 9/2016 | Heo | H01L 22/20 |

(Continued)

OTHER PUBLICATIONS

Mack, Chris A., "Depth of Focus," The Lithography Tutor, (Spring 1995), 8 pages.

(Continued)

*Primary Examiner* — Omar F Mojaddedi
(74) *Attorney, Agent, or Firm* — Slater Matsil, LLP

(57) ABSTRACT

A method for fabricating a semiconductor device is described that includes forming a base layer over a top layer of a substrate, the base layer includes a silicon based dielectric having a thickness less than or equal to 5 nm and greater than or equal to 0.5 nm; forming a photoresist layer over the base layer, the photoresist including a first side and an opposite second side; exposing a first portion of the photoresist layer to a pattern of extreme ultraviolet (EUV) radiation from the first side; exposing a second portion of the photoresist layer with a pattern of electron flux from the second side, the electron flux being directed into the photoresist layer from the base layer in response to the EUV radiation; developing the exposed photoresist layer to form a patterned photoresist layer; and transferring the pattern of the patterned photoresist layer to the base layer and the top layer.

20 Claims, 6 Drawing Sheets

(56) References Cited

U.S. PATENT DOCUMENTS

| | | | |
|---|---|---|---|
| 2017/0186614 A1* | 6/2017 | Ko | H01L 21/31144 |
| 2017/0199456 A1 | 7/2017 | Park | |
| 2018/0239244 A1* | 8/2018 | Raley | H01L 21/3086 |
| 2019/0198342 A1* | 6/2019 | Jang | H01L 21/3085 |
| 2019/0393035 A1* | 12/2019 | O'Meara | H01L 21/02186 |
| 2020/0013629 A1* | 1/2020 | de Roest | H01L 21/324 |
| 2021/0033959 A1 | 2/2021 | Han | |
| 2023/0152701 A1* | 5/2023 | Kanakasabapathy | H01L 21/0274 430/273.1 |

OTHER PUBLICATIONS

Xu, Hao, et al., "Underlayer designs to enhance the performance of EUV resists," In Advances in Resist Materials and Processing Technology XXVI, vol. 7273, 72731, J. International Society for Optics and Photonics, 2009, 11 pages.

PCT International Search Report and Written Opinion, PCT Application No. PCT/US2022/040775, dated Dec. 19, 2022, 10 pages.

* cited by examiner

EXTREME ULTRAVIOLET LITHOGRAPHY PATTERNING METHOD

TECHNICAL FIELD

The present invention relates generally to a method for fabricating semiconductor devices, and, in particular embodiments, to a method for patterning a layer using extreme ultraviolet (EUV) lithography.

BACKGROUND

Generally, a semiconductor integrated circuit (IC) is fabricated by sequentially depositing a dielectric, conductive, or semiconductor layer over a semiconductor substrate and patterning the layer using photolithography and etch to form electronic and interconnect elements like transistors, resistors, capacitors, metal lines, contacts, and vias in one monolithic structure. At each new technology node, feature sizes are shrunk, doubling the packing density to reduce cost. A direct way to print a higher resolution pattern is to use a shorter wavelength light source. The 248 nm deep ultraviolet (DUV) KrF laser, used to print critical patterns at the 250 nm and 130 nm nodes, is replaced by the 193 nm ArF laser, starting at the 90 nm node. Features down to 35 nm may be printed using 193 nm lithography with resolution enhancement techniques, such as immersion lithography. The 193 nm optics is further extended to 14 nm and even 10 nm nodes using multiple patterning techniques, but at higher cost and processing complexity associated with the additional masks. At the sub-10 nm regime, DUV may be replaced by the even shorter 13.5 nm wavelength extreme ultraviolet (EUV) technology. While EUV promises high resolution patterning with fewer masks, it has to overcome the engineering hurdles to bring together all the components of photolithography (radiation source, scanner, mask, and resist) in a system that has the reliability and throughput of a manufacturing system. One factor limiting throughput of EUV patterning is the generally higher exposure dose needed relative to DUV patterning. Further innovations are needed in this area for successful deployment of EUV lithography in high volume semiconductor IC manufacturing.

SUMMARY

A method for fabricating a semiconductor device includes: forming a base layer over a top layer of a substrate, the base layer including a silicon based dielectric having a thickness less than or equal to 5 nm and greater than or equal to 0.5 nm; forming a photoresist layer over the base layer, the photoresist including a first side and an opposite second side; exposing a first portion of the photoresist layer to a pattern of extreme ultraviolet (EUV) radiation from the first side; exposing a second portion of the photoresist layer with a pattern of electron flux from the second side, the electron flux being directed into the photoresist layer from the base layer in response to the EUV radiation; developing the exposed photoresist layer to form a patterned photoresist layer; and transferring the pattern of the patterned photoresist layer to the base layer and the top layer.

A method for forming an etch mask over a substrate, the method includes: forming an electron booster layer adhering to a major surface of the substrate; exposing the major surface of the electron booster layer to a hydrogen-containing gas to convert the major surface be hydrophobic; forming a photoresist layer adhering to the hydrophobic major surface of the electron booster layer; exposing a first portion of the photoresist layer with a pattern of extreme ultraviolet (EUV) radiation; exposing a second portion of the photoresist layer with electron flux directed from the electron booster layer, where a portion of the EUV radiation is absorbed below the photoresist layer to generate the electron flux; developing the exposed photoresist layer to form a patterned photoresist layer; and patterning the electron booster layer with the patterned photoresist layer to form a patterned electron booster layer, the etch mask being the combined patterned electron booster layer and the patterned photoresist layer remaining after patterning the electron booster layer.

A method for patterning a substrate includes: preparing a plurality of test substrates, where each test substrates has a substantially same top layer; forming a lithography stack over the top layer of each of the plurality of test substrates, the lithography stack including a base layer and a photoresist layer disposed over the base layer, where the base layer in each of the plurality of test substrates has a different combination of thickness and composition; patterning each photoresist layer with an extreme ultraviolet (EUV) lithography process, by exposing the photoresist layer to a pattern of EUV radiation in a focus-exposure matrix; obtaining patterning metrics by measuring the patterned photoresist layer of each of the plurality of test substrates; and based on the patterning metrics, selecting a first type of base layer, the first type of base layer having a specific combination of a first thickness and a first composition for forming a first base layer of a lithography stack for an EUV lithography process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
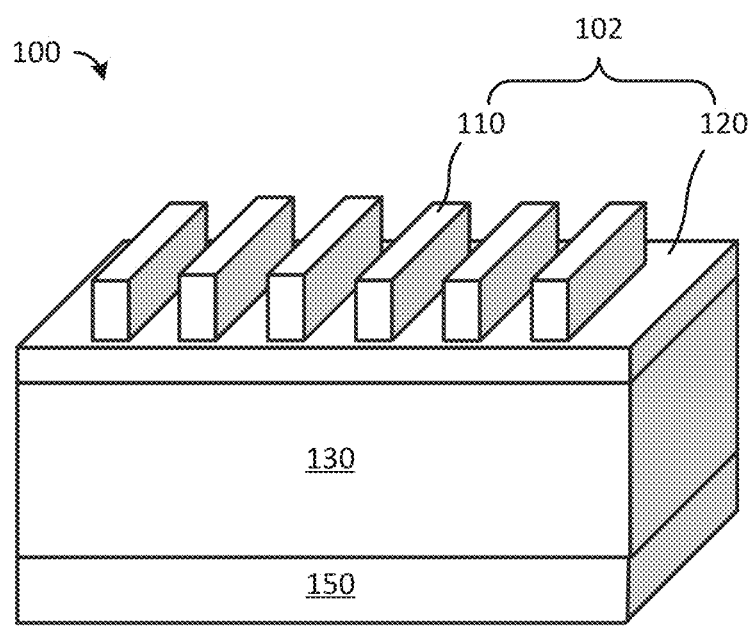
FIG. 1 is a perspective view of a lithography stack over a substrate, in accordance with an embodiment.

This disclosure describes methods of patterning a substrate using extreme ultraviolet (EUV) lithography in a process flow for fabricating a semiconductor integrated circuit (IC). The example embodiments utilize a method of selecting a lithography stack that helps reduce an exposure dose to increase throughput and, thereby lower manufacturing cost.

The photolithography process comprises forming a patterned photoresist etch mask by exposing the photoresist to a pattern of actinic radiation. In an EUV lithography process, the actinic radiation typically has a wavelength around 13.5 nm. The short wavelength of 13.5 nm EUV holds promise in printing high resolution patterns without incurring the extra cost of multiple patterning techniques that are used to extend the resolution capability of the much longer wavelength 193 nm deep ultraviolet (DUV) and immersion DUV (iDUV) lithography. With iDUV and multiple patterning, the number of masks and the associated processing steps may become prohibitively expensive for a process flow for manufacturing advanced IC designs at, for example, the 5 nm technology node. However, as known to persons skilled in the art, the promise of EUV lithography's single patterning capability of printing a fine pattern (e.g., a 30 nm pitch line-and-space array) with one masking level has its own costs. A commercial EUV scanner remains several times more expensive compared to an advanced 193 nm iDUV scanner despite the progress made in developing various components of EUV lithography technology such as radiation source, optics, photoresist, and optical mask technology.

Another factor that offsets the cost savings achievable with single patterning is the cost of a relatively high exposure dose of EUV lithography. Exposing the photoresist to a higher radiation dose may lengthen exposure time, thereby reducing throughput and increasing manufacturing cost. The 14.3 times higher photon energy (92 eV) of 13.5 nm EUV radiation relative to the 6.4 eV photon energy of 193 nm DUV radiation is partly responsible for the relatively high dose of EUV radiation used to expose the photoresist. For example, consider a typical dose of 20 mJ/cm$^2$ used to expose photoresist in a 193 nm iDUV lithography process. The photon energy being 6.4 eV, this translates to irradiating the photoresist with about 200 photons/nm$^2$. But, at the high photon energy of the 13.5 nm EUV radiation, 20 mJ/cm$^2$ is roughly equivalent to just 14 photons/nm$^2$, which may be insufficient to adequately expose the photoresist. Furthermore, the probability that the 92 eV photon penetrates a photoresist film about 200 nm thick is higher than that for the 6.4 eV photon.

Photons absorbed in the photoresist layer chemically alter some of the unexposed photoresist molecules to exposed photoresist by photochemical reactions. The photoresist may also be exposed with energetic electrons. Some of the energetic electrons are generated by photons that penetrate the photoresist and get absorbed in the underlying layers. The EUV photon absorption process generates energetic photoelectrons in the underlying layers which, in turn, generate secondary electrons. While EUV photons absorbed in the photoresist also generates secondary electrons, a larger number of secondary electrons may be generated by photon absorption in the underlying layers. A fraction of the emitted electrons may enter the photoresist layer from the underlayers and interact with unreacted photoresist molecules inducing electrochemical reactions that effectively expose the unreacted photoresist. The photoresist used in EUV lithography being typically a positive photoresist, the exposed photoresist is removed when it is developed during a subsequent process step to form a patterned photoresist masking layer. The embodiments described in this disclosure provide examples of methods which boost the exposure of EUV photoresist with energetic electrons, thereby help reduce the EUV radiation dose needed to pattern the photoresist layer.

FIG. 1 shows a perspective view of a semiconductor device in a substrate 100. The view illustrates the substrate 100 at an intermediate stage of processing of an EUV lithography process 200, described in further detail below with reference to FIG. 2 and FIGS. 3A-3D. An incoming substrate 100 having a top layer 130 is patterned using the EUV lithography process 200. The top layer 130 may be, for example, a hard mask layer used as a masking layer at a subsequent etch step. In some embodiments, the hard mask material for the top layer 130 may comprise an organic layer such as spin-on carbon (SOC), amorphous carbon layer (ACL), organic dielectric layer (ODL), and organic planarization layer (OPL). In other embodiments, other hard mask layer materials may be used. For example, the hard mask layer material may comprise dielectrics such as silicon nitride, silicon oxide, and metal oxides (e.g., aluminum oxide and hafnium oxide) or metals such as titanium and titanium nitride, or the like.

A two-layer EUV lithography stack 102 comprising a base layer 120 and a photoresist layer no is shown formed over the top layer 130. A lithography stack refers to a sacrificial stack of layers formed over the surface of an incoming substrate that participate in the processing used in transferring a pattern of actinic radiation to the layer adjacent below the lithography stack, for example, the top layer 130 in FIG. 1. It is noted that, although the top layer 130 may be a hard mask layer used to etch a target layer further below, we chose not to name the top layer 130 as a layer of the lithography stack 102 because, in the example embodiments, the combination of the photoresist layer 110 and the base layer 120 is used as the etch mask in transferring an EUV radiation pattern to the incoming substrate 100 of the EUV lithography process 200.

In the perspective view illustrated in FIG. 1, the photoresist layer 110 has been exposed and developed to form a dense pattern of parallel lines. The photoresist layer 110 being photosensitive to 13.5 nm EUV radiation, the pattern of the EUV radiation (e.g., the pattern of dense lines) may be transferred to the photoresist layer 110. The base layer 120 serves multiple purposes. Generally, the base layer 120 is more resistant than the photoresist layer 110 to etchants used in a pattern transfer etch transferring the EUV radiation pattern from the photoresist layer no to the top layer 130 of the substrate 100. Hence, the base layer 120 may be utilized as a hard mask in patterning the top layer 130. In addition, using the methods described in this disclosure, the composition and thickness of the base layer 120 may be selected to help boost exposing the photoresist layer no with energetic electrons.

The layers below the top layer 130 are collectively illustrated by a semiconductor substrate layer 150. The semiconductor substrate layer 150 comprises various dielectric, metallic, and semiconductor layers formed over a starting substrate that may include a single crystal semiconductor. The starting substrate may comprise bulk silicon, epitaxial silicon over bulk silicon, gallium arsenide, silicon carbide, germanium, silicon on insulator (SOI), or heterostructures such as gallium nitride on silicon, silicon on sapphire, and the like, and may further include epitaxially grown embedded semiconductor regions such as embedded silicon germanium.

The EUV lithography process 200 used to pattern the top layer 130 is described below with reference to the flow diagram in FIG. 2 and several cross-sectional views of the substrate 100 at various intermediate stages of processing, illustrated in FIGS. 3A-3D.

A method of patterning the top layer 130 of the substrate 100 comprises executing a design of experiment (DOE) designed to select a first type of base layer. In this document, type of base layer refers to a particular combination of material composition and layer thickness of the base layer.

Accordingly, the first type of base layer would be the combination of a first composition and a first thickness. The selected first type of base layer may be used in the EUV lithography process 200 as the base layer 120 of the lithography stack 102 in FIG. 1. A method 400 for selecting the first type of base layer by performing a DOE with multiple types of base layers is described further below with reference to a flow diagram illustrated in FIG. 4 and an example data plot 500 illustrated schematically in FIG. 5. The method 400 selects the first type of base layer according to its ability to promote irradiating the photoresist with a pattern of electron flux from below. When selected using the method 400 and used in the lithography stack 102 in the lithography process 200, the base layer 120 may enhance the fraction of photoresist that gets exposed by the influx of energetic electrons from layers below the photoresist layer 110. Increasing the fraction of photoresist exposed with energetic electrons from below implies reducing the amount of photoresist that has to be exposed by the flux of EUV photons from above, thereby allowing the radiation dose for the EUV lithography process 200 to be reduced by, for example, about 10% to about 50%.

Figure 6:
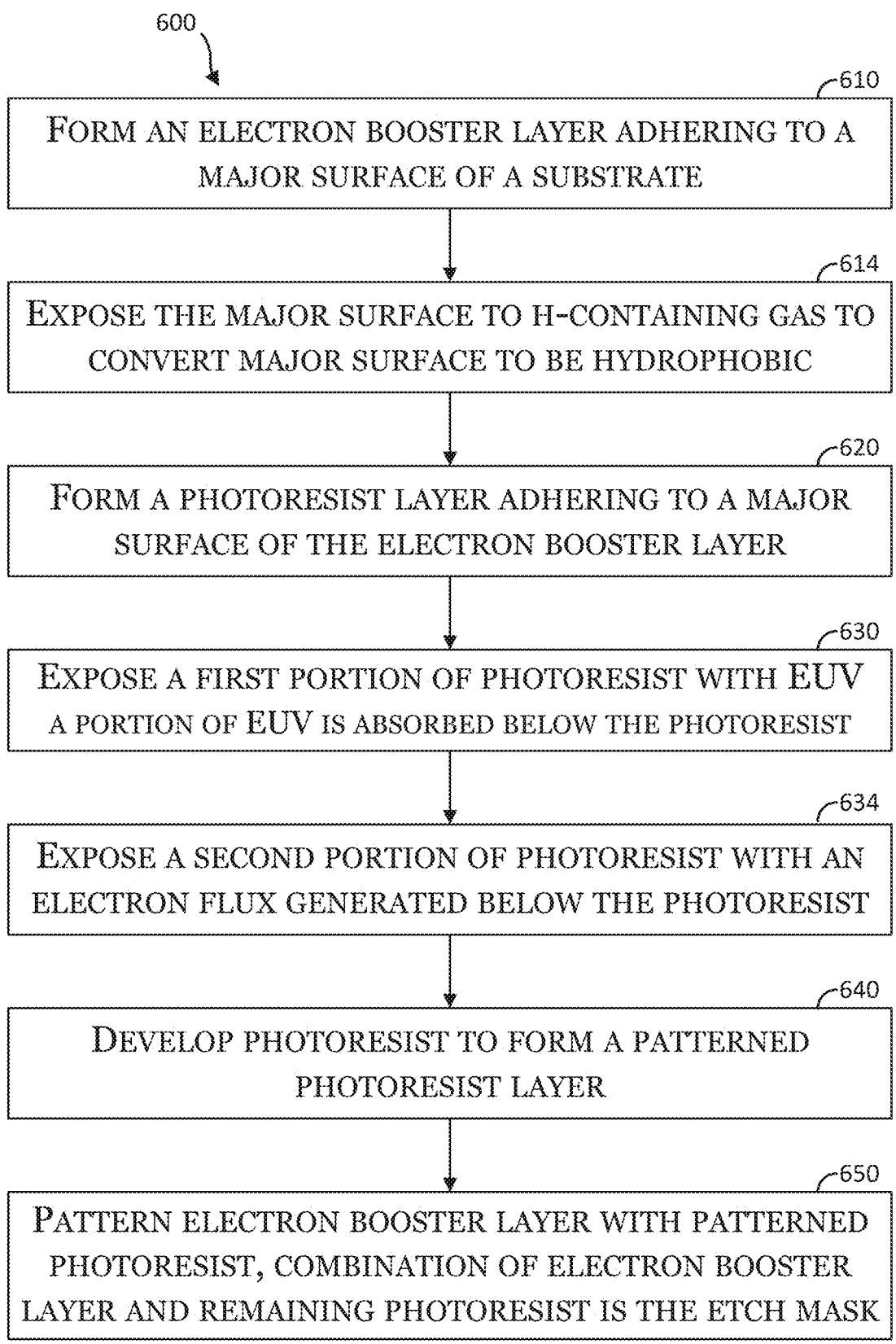
FIG. 6 is a flow diagram illustrating a method for forming an etch mask over a substrate, in accordance with an embodiment.

FIG. 6 describes a method 600 of forming an etch mask used in transferring an EUV radiation pattern to the incoming substrate comprising the top layer 130 and the semiconductor substrate layer 150. The etch mask may be the combination of the patterned base layer 120 and the remaining photoresist layer 110, shown as the lithography stack 102 in FIG. 3C. A cross-sectional view of the patterned structure after the pattern has been transferred to the top layer 130 is illustrated in FIG. 3D. The base layer 120 may be selected to boost photoresist exposure by electrons from below the photoresist layer 110, using, for example, the selection method 400. Hence, the base layer 120 is described as an electron booster layer in the flow diagram for the method 600 illustrated in FIG. 6.

Figure 2:
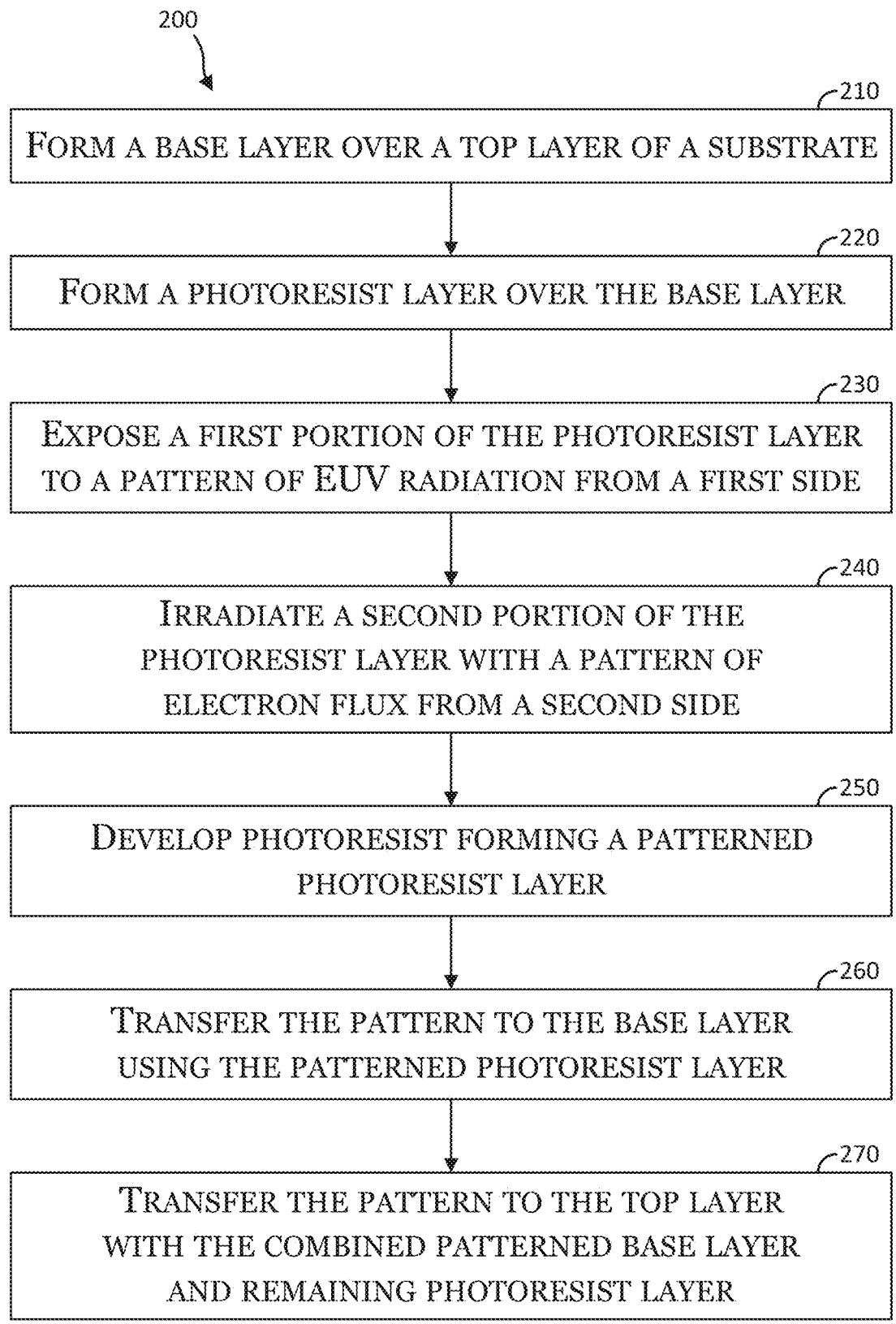
FIG. 2 is a flow diagram illustrating a method for fabricating a semiconductor device, in accordance with an embodiment.
Figure 3A:
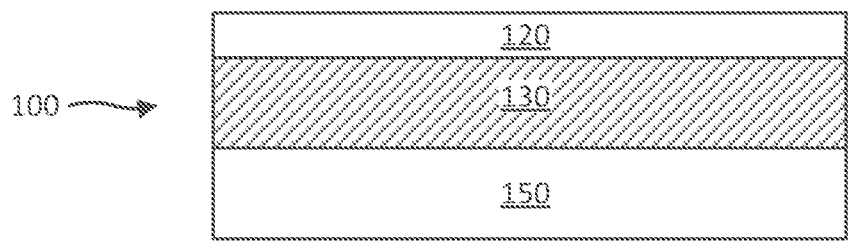
FIGS. 3A-3D illustrate cross-sectional views of a substrate at various intermediate stages of a process flow for fabricating a semiconductor device, in accordance with an embodiment.
Figure 3B:
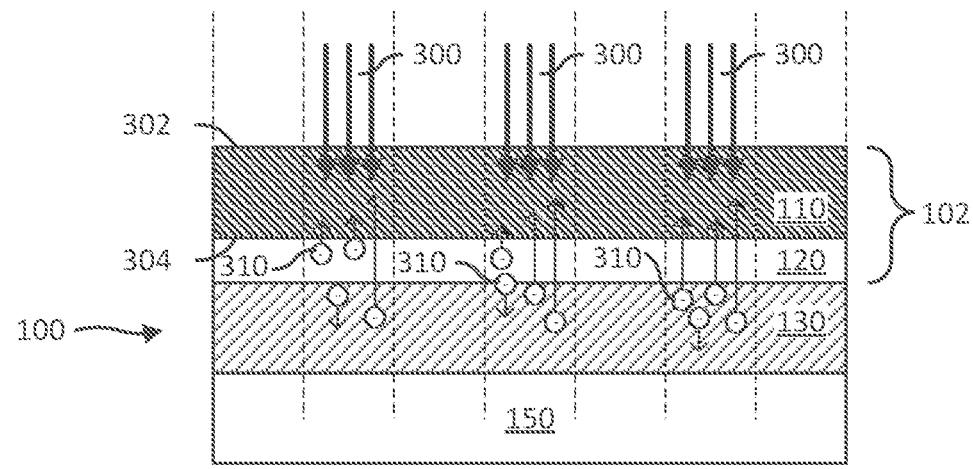
Figure 3C:
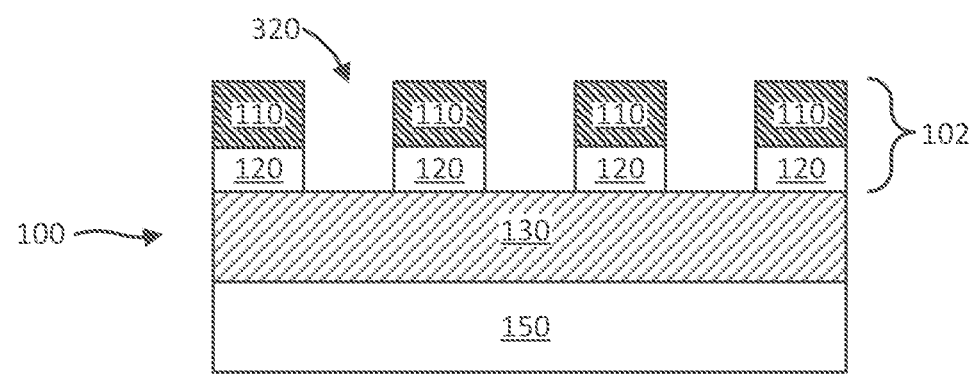
Figure 3D:
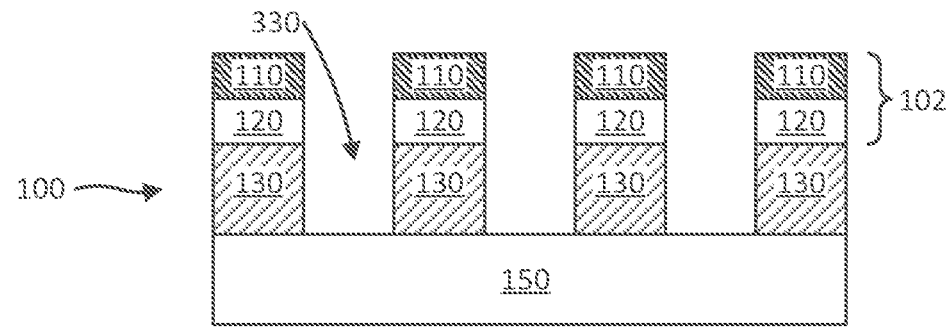

Referring now to FIG. 2 and FIGS. 3A-3D, the base layer 120 of the lithography stack 102 is formed over the top layer 130 of an incoming substrate 100, as indicated by box 210 in the flow diagram in FIG. 2 and the cross-sectional view in FIG. 3A. The base layer 120 may be formed using a suitable deposition technique such atomic layer deposition (ALD), plasma-enhanced ALD (PEALD), chemical vapor deposition (CVD), plasma-enhanced CVD (PECVD), physical vapor deposition (PVD), or the like. In some embodiment, forming the base layer 120 comprises performing an ALD process that comprises exposing the top layer of the substrate to a gas mixture comprising water vapor. In some other embodiment, forming the base layer 120 comprises performing a cyclic chemical vapor deposition (CVD) process that comprises exposing the substrate to a low temperature oxide precursor for SiOC(N).

In various embodiments, the base layer 120 may comprise various materials which belong broadly to two categories: (i) materials comprising metal atoms and, (ii) substantially metal-free silicon-based dielectrics. The metal-containing materials may be metallic conductors or metal-oxide insulators. Examples of metallic conductors include titanium, titanium nitride, tantalum nitride, aluminum nitride, tungsten, molybdenum, and ruthenium. Examples of metal oxide insulators include aluminum oxide, hafnium oxide, zirconium oxide, titanium oxide, tantalum oxide, manganese oxide, tin oxide, and indium oxide. By silicon-based dielectrics it is implied that the molar fraction of Si and the molar fraction of at least one of O, C, and N is greater than 10 atomic %. Examples include silicon carbide, silicon carbonitride, carbon-doped silicon oxide, silicon oxycarbonitride, and silicon nitride.

Many of the materials for the base layer 120 are formed having a hydrophilic surface. Since photoresist is hydrophobic and has poor adhesion to hydrophilic surfaces, a surface modification step is generally performed to improve adhesion of photoresist to the major surface of the base layer 120, as discussed above. After forming the base layer 120, a surface modification process step may be performed to enhance adherence of photoresist to a major surface of the base layer 120. Generally, photoresist has poor adherence to hydrophilic surfaces, so the surface modification step may result in the major surface of the base layer 120 being made hydrophobic. In some embodiments, modifying the major surface of the base layer 120 comprises exposing the major surface to hydrogen radicals (H*), depositing a hydrocarbon ($CH_x$) coating over the major surface, or annealing the substrate in an ambient comprising hydrogen gas. In some other embodiments, modifying the major surface of the base layer 120 comprises coating the surface with a self-assembled monolayer (SAM). Examples of SAM include n-octadecyltrimethoxysilane (ODS: $H_3C(CH_2)17Si(OCH_3)_3$), heptadecafluoro-1,1,2,2-tetrahydro-decyl-1-trimethoxysilane (FAS: $F_3C(CF_2)_7(CH_2)2Si(OCH_3)_3$), n-(6-aminohexyl)aminopropyltrimethoxysilane (AHAPS: $H_2N(CH_2)6NH(CH_2)3Si(OCH_3)_3$, and 4-(chloromethyl)phenyltrimethoxysilane (CMPhS: $H_2ClC(C_6H_4)Si(OCH_3)_3$).

As indicated in box 220 of the flow diagram for the EUV lithography process 200 and FIG. 3B, the substrate 100 is coated with the photoresist layer 110 over the major surface of the base layer 120 after the surface modification process step (described above) is complete. The combined base layer 120 and photoresist layer 110 forms the two-layer lithography stack 102. In FIG. 3B (and box 230 in FIG. 2), the photoresist layer 110 is being exposed to the EUV radiation 300 projected in a pattern comprising alternating lines of light and darkness. The dashed lines in FIG. 3B delineate the boundaries between light and dark regions. A region where EUV radiation 300 is present is indicated by a group of three parallel arrows pointing downwards and a region that is dark is indicated by an absence of arrows. In the example illustrated in FIG. 3B, positive photoresist is used. Accordingly, the photoresist would be removed from a region irradiated with the EUV radiation 300, while photoresist would remain in a region that is dark, resulting in transferring a light and dark pattern of EUV radiation 300 to a line and space photoresist pattern in the photoresist layer 110, the photoresist lines being located in the dark regions in the pattern of EUV radiation 300.

As explained below, the EUV radiation 300 generally exposes only a fraction or a first portion of the photoresist layer 110 by photon absorption in the photoresist. The EUV radiation 300 enters the photoresist layer 110 from one side (the top side), referred to as the first side 302. The remaining portion or a second portion comprises photoresist molecules which have not participated in photon absorption or interaction with electrons generated from photon absorption in the photoresist. Photoresist in the second portion of the photoresist layer 110 is exposed because of the presence of the base layer 120 and the top layer 130. Energetic electrons 310 generated in the base layer 120 and the top layer 130 enters the photoresist layer 110 from the opposite side (the bottom side), referred to as the second side 304. In one or more embodiments, the second portion is less than the first portion but more than 10% of the total volume of the photoresist layer 110.

As explained above, because of the high photon energy, energetic electrons 310 may be generated from the portion of EUV radiation 300 that penetrate the photoresist layer 110 and is absorbed in the layers below, such as the base layer 120 and the top layer 130, as illustrated in FIG. 3B. A fraction of the energetic electrons 310 may enter the photoresist layer, as indicated schematically in FIG. 3B by arrows attached to the energetic electrons 310. Because the emission of energetic electrons 310 is a result of photon absorption, the electron flux mimics the pattern of the EUV radiation 300. Irradiating the photoresist layer 110 with a pattern of electron flux comprising energetic electrons 310 (as indicated in box 240 of the flow diagram in FIG. 2) may expose some of the photoresist molecules which have not been exposed by the photochemical reactions induced by EUV photons. The result of exposing photoresist with energetic electrons is very similar to exposing photoresist with photons. Indeed, when an EUV photon is absorbed by the photoresist, the energy released from the photon generates a cascade of secondary electrons which, in turn, interact with the photoresist via electrochemical reactions. Exposing a positive photoresist to either photons or energetic electrons breaks covalent bonds converting the relatively insoluble unexposed positive photoresist polymer to a form that may be dissolved by a chemical developer.

As also explained above, enhancing the electron flux to expose more of the photoresist layer 110 to energetic electrons 310 from the second side helps reduce the EUV radiation dose used in the photoresist exposure step (box 230 in FIG. 2) of the EUV lithography process 200. The methods described further below with reference to FIGS. 4-6 comprise adjusting the composition and thickness of the base layer 120 to enhance the electron flux by influencing the generation rate of energetic electrons 310 and the transport of energetic electrons 310 from the top layer 130 to the photoresist layer 110.

As indicated in box 250 in the flow diagram of the EUV lithography process 200, the photoresist layer 110 is developed using, for example, a chemical solvent that removes exposed photoresist. The patterned photoresist layer 110 may be the masking layer for transferring the EUV radiation pattern to the base layer 120, as indicated in box 260 in FIG. 2. FIG. 3C illustrates a cross-sectional view of the substrate 100 showing the resulting patterned photoresist layer 110 and the patterned base layer 120. Spaces 320 in FIG. 3C are shown formed in the regions in FIG. 3B which were irradiated with EUV radiation 300 and the electron flux created by photogeneration and secondary electron emission of energetic electrons 310. The spaces 320 in the patterned photoresist layer no expose a surface of the base layer 120, and a subsequent etch step extends the spaces 320 through the base layer 120 to expose a portion of the top layer 130 of the substrate 100. As illustrated in FIG. 3C, the dark regions are protected by photoresist lines of the patterned photoresist layer 110 that are remaining after the patterned base layer 120 has been formed. The combined patterned base layer 120 and the remaining patterned photoresist layer 110 form the lithography stack 102 in FIG. 3C. The lithography stack 102 in FIG. 3C may be an etch mask used in a subsequent anisotropic etch step to transfer the EUV radiation pattern to the top layer 130 of the substrate 100, as indicated in box 270 in the flow diagram of the EUV lithography process 200 and the cross-sectional view in FIG. 3D.

In some embodiments, the pattern transfer etch processes, indicated in box 260 and box 270 of the flow diagram in FIG. 2 and illustrated by the cross-sectional view in FIG. 3D, may be performed using, for example, a two-step anisotropic plasma etch such as a two-step reactive ion etch (RIE) process. The first step may remove the exposed portions of the base layer 120 to form a patterned base layer 120, and the second step may transfer the pattern to the top layer 130.

During the anisotropic etch step used to etch the top layer 130 (box 270 in FIG. 2), the patterned base layer 120 may be used as a hard mask layer in combination with the remaining patterned photoresist layer 110 (shown in FIG. 3C) to extend the depth of the spaces 320 in FIG. 3C to form the higher aspect ratio spaces 330 with near vertical sidewalls, as illustrated in FIG. 3D. FIG. 3D illustrates a cross-sectional view of the state of the substrate 100 after the pattern transfer etch indicated by box 270 is complete and a surface of the semiconductor substrate layer 150 has been exposed. In some embodiments, the etch chemistry used to remove the exposed region of the top layer 130 may not be very selective to photoresist, especially if the top layer 130 comprises an organic material, as is indicated by the significantly reduced thickness of the photoresist layer 110 in FIG. 3D. It is possible that, in some region of the substrate 100, all the photoresist may be eroded and the pattern integrity would rely on the pattern transfer etch to be highly selective to the base layer material of the base layer 120.

Figure 4:
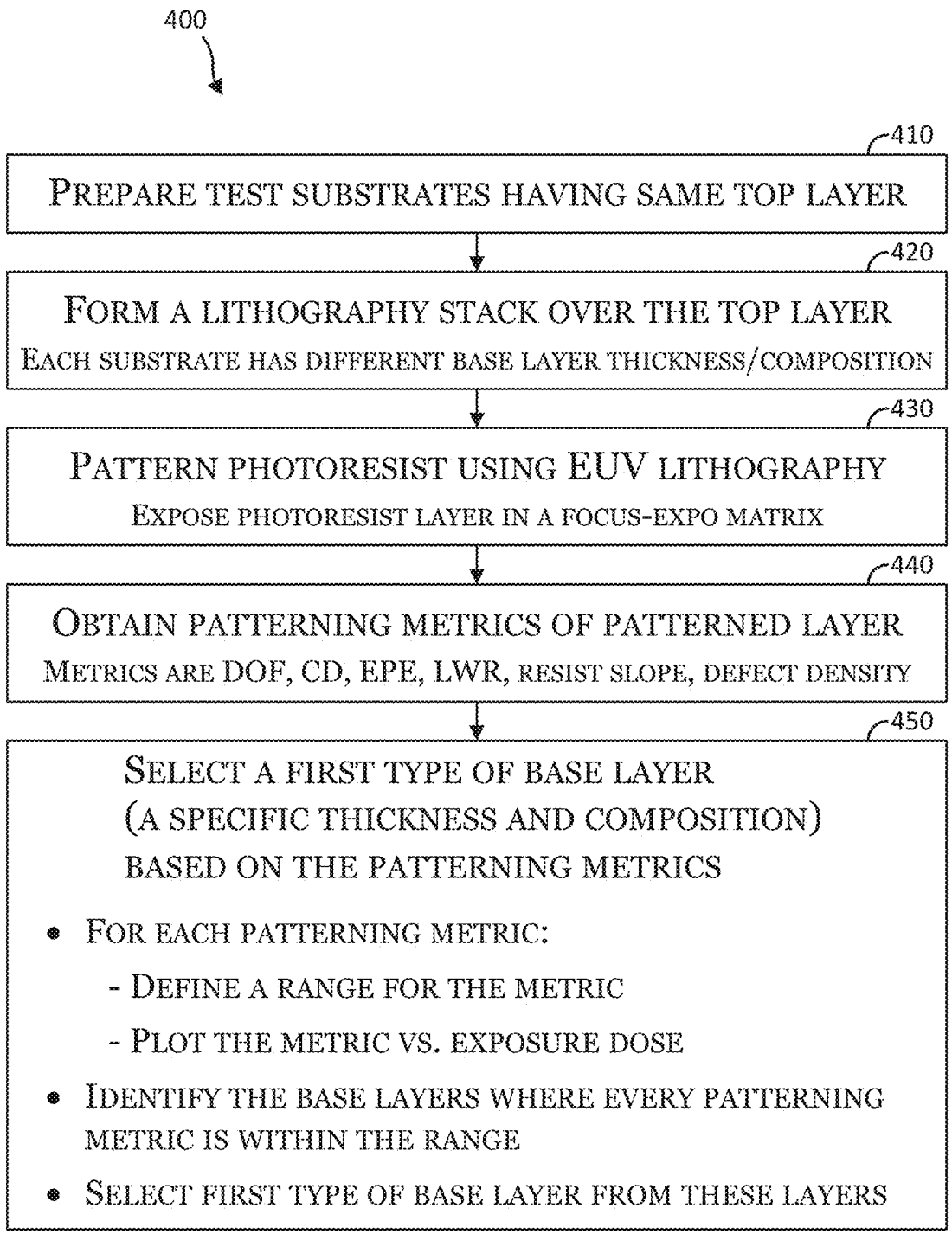
FIG. 4 is a flow diagram illustrating a method for patterning a substrate, in accordance with an embodiment.

FIG. 4 illustrates a flow diagram of the method 400 to select a type of base layer for use as the base layer 120 in the lithography stack 102 described above. The selection method 400 may be used to select a first type of base layer to form the base layer 120 seen in FIG. 1 and in FIGS. 3A-3D. Method 400 selects the first type of base layer to have a specific combination of a first composition and a first thickness that promotes secondary exposure of the photoresist layer 110 with the influx of energetic electrons 310 from layers below the photoresist layer 110 (see FIG. 3B). The secondary exposure complements the direct exposure by photon absorption in the photoresist layer 110.

The factors varied in the DOE to select the first type of base layer from multiple types of base layers may be material composition (e.g., atomic percentages of constituent atoms) and film thickness. In some embodiments, the factors may include various surface treatments. As indicated in box 410 in the flow diagram in FIG. 4, the method 400 starts with preparing a plurality of test substrates, each having a top layer that is similar to the top layer 130 of the incoming substrates for the EUV lithography process 200, described above.

As indicated in box 420 in the flow diagram of the method 400, a two-layer lithography stack, similar to the lithography stack 102 (see FIGS. 3B-3D), may be formed over the top layer of each of the plurality of test substrates. The two-layer lithography stack comprises a base layer and a photoresist layer coated over the base layer. The same photoresist layer is used in each test substrate but, in order to perform the experiment, the base layer in each test substrate may be formed to have a different combination of thickness and composition, in accordance with the DOE.

Next, as indicated in box 430 in the flow diagram in FIG. 4, each of the photoresist layers is patterned by exposing the test substrates to a pattern of EUV radiation using an EUV projection stepper and then developing the exposed photoresist layer. The photolithography process is similar to the process used to form the patterned photoresist layer 110, illustrated in FIGS. 1 and 3C, except each photoresist layer is exposed in a focus-exposure matrix. When exposing the photoresist layer of the test substrate in a focus-exposure matrix, the same EUV radiation pattern is projected onto each die of a matrix of dice but using a different combination of exposure dose and height of the focal plane as the stepper steps from one die location to the next. For example, all die along a row may be irradiated with a fixed exposure dose but the height of the focal plane may be incremented between adjacent die in the row and, all die along a column may be projected onto the same focal plane but the exposure dose may be incremented between adjacent die in the column. The technique of exposing a test substrate with a focus-exposure matrix may be used to estimate the depth of focus (DOF) for a given exposure dose.

After exposing the plurality of test substrates to EUV radiation, the photoresist layers are patterned using a suitable process to remove exposed regions of the photoresist. Measurements are performed on the patterned photoresist layers to obtain various patterning metrics, as indicated in box 440 of the flow diagram for method 400. Examples of patterning metrics include DOF, critical dimension (CD) such as photoresist linewidth in a critically important pattern, edge placement error (EPE), line width and line edge roughness (LWR and LER), photoresist profile metrics such as sidewall slope and photoresist foot, defect density of various patterning defects such as bridges, opens, photoresist collapse, photoresist peeling, and scumming. Some of the patterning metrics may be measured using destructive techniques.

In box 450 of the flow diagram for the method 400, the first type of base layer is selected based on the patterning metrics obtained from the experimental test substrates, as described above. The first type of base layer specifies the first base layer, which would be the base layer 120 in the EUV lithography process used for manufacturing semiconductor devices. An objective of the selection process is to select a specific combination of composition and thickness for the base layer 120 such that a relatively low EUV exposure dose may be used by having about 10% to about 50% of the photoresist electrochemically exposed by the influx electrons from layers below the photoresist layer 110 with negligible adverse impact on the photoresist pattern quality. As explained above, lowering the exposure dose may provide the advantage of achieving a higher throughput in manufacturing.

One example selection process is outlined in box 450 of the flow diagram in FIG. 4. The selection process comprises, for each patterning metric of interest, defining an acceptable range and obtaining a relationship between exposure dose and the patterning metric measured for each base layer of the multiple types of base layers of the DOE. If all the patterning metrics for a photoresist pattern formed over a base layer are found to be within their respective acceptable range then the base layer and the respective EUV lithography process would be acceptable for manufacturing semiconductor devices.

Figure 5:
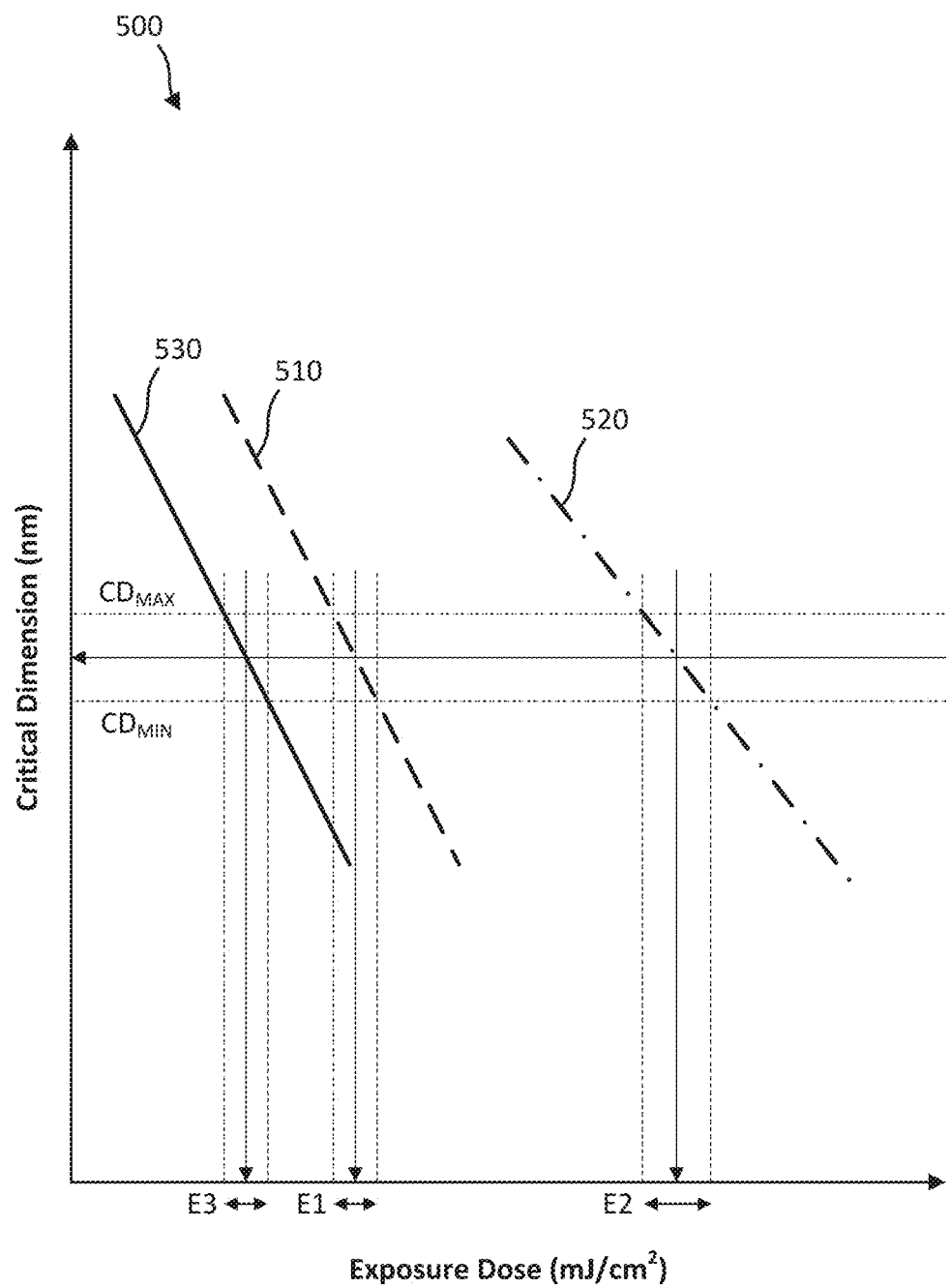
FIG. 5 illustrates a schematic of plots of patterning data used in a method of patterning a substrate, in accordance with an embodiment.

Now, consider an example patterning metric, such as CD. FIG. 5 schematically illustrates three plots 510, 520, and 530 of measured CD vs. exposure dose for each of three types of base layers. Plot 510 may be displaying CD measurements measured from the photoresist pattern formed over a reference base layer having a reference composition (e.g., carbon-doped silicon oxide with 10 atomic % of carbon) and a reference thickness (e.g., 2.5 nm). Plot 520 may be from measurements taken from the test substrate using a carbon-doped silicon oxide base layer having, for example, the same 2.5 nm thickness but 30 atomic % of carbon, and plot 530 may be CD data from the test substrate having the reference composition (carbon-doped silicon oxide with 10 atomic % of carbon) but 1.5 nm thick. The acceptable range for CD is indicated by horizontal dotted lines marked $CD_{MIN}$ and $CD_{MAX}$ around a target CD indicated by a horizontal arrow. A range of exposure dose in which the measured CD is acceptable is indicated by a pair of vertical dotted lines around a central exposure dose indicated by a vertical arrow. None of the three base layers may be rejected based on the plots 510, 520, and 530. However, if the plot of, for example, LWR vs. exposure dose shows that the LWR data from the reference base layer, is unacceptably high in the exposure dose range E1, identified from plot 510 in FIG. 5, then the reference base layer has to be rejected.

If we further assume, for example, that the 2.5 nm thick carbon-doped silicon oxide base layer with the 30 atomic % carbon as well as the 1.5 nm thick carbon-doped silicon oxide base layer with the 10 atomic % carbon have all the patterning metrics of interest in their respective acceptable ranges for a common exposure dose range (e.g., E2 for the base layer of plot 520 and E3 for the base layer of plot 530) then both types of base layers are candidates to be considered for selection as the first type base layer. Since E3 comprises lower exposure doses relative to E2, the base layer for the plot 530 in FIG. 5 may be selected as the first base layer and the 1.5 nm thickness in combination with the composition of carbon-doped silicon oxide with 10 atomic % carbon, 45 atomic % silicon, and 45 atomic % oxygen may be the respective first type of base layer. It is understood that this example is for illustrative purposes only, illustrating the method 400 in FIG. 4.

Several DOE with silicon-based dielectrics as the base layer material have been executed using the methods described above. The composition of each of the base layers comprises a composition of silicon (Si), oxygen (O), carbon (C), and nitrogen (N) atoms, wherein the molar fraction of Si and the molar fraction of at least one of O, C, and N is greater than 10 atomic %. The experiments may be described as being in five broad groups. The multiple types of base layers in one group are similar in composition. A first group comprises base layer materials of the type similar to silicon carbide ($Si_xC_{1-x}$). A second group comprises base layer materials of the type similar to silicon nitride ($Si_xN_{1-x}$). A third group comprises base layer materials of the type similar to silicon carbonitride ($Si_xC_yN_{1-y}$). A fourth group comprises base layer materials of the type similar to carbon-doped silicon oxide ($Si_xO_yC_{1-x-y}$). A fifth group comprises base layer materials of the type similar to silicon oxycarbonitride ($Si_xO_yC_zN_{1-x-y-z}$).

Using the patterning data measured from the patterned photoresist layers formed using test wafers of these experiments and the two-layer lithography stack 102 of the EUV lithography process 200, described above, the inventors have identified several types of base layer (specific combinations of composition and thickness) which may be selected to be the first type of base layer to form the first base layer. These first base layers may enhance the exposure of photoresist by the electron flux of the energetic electrons 310 (see FIG. 3B) to achieve a reduction in the exposure dose of the EUV radiation 300 (see FIG. 3B) by about 10% to about 50%. For example, the carbon content has been identified to be between about 40 atomic % and 50 atomic % for embodiments similar to silicon carbide, and between about 10 atomic % and 30 atomic % for embodiments similar to silicon carbonitride or silicon oxycarbonitride.

Energetic electrons 310 generated in the top layer 130 below the first base layer are more likely to reach the photoresist above the first base layer if the first base layer thickness is reduced. In some embodiments, for example, in embodiments using a silicon-based dielectric, the photon absorption and secondary electron generation in the top layer 130 may greatly exceed the photon absorption and secondary electron generation in the first base layer comprising silicon based dielectric. Accordingly, it may be advantageous to select a thin first base layer to boost the electron flux into the photoresist layer 110 from below. Reducing the thickness facilitates transport of energetic electrons 310 through the dielectric material to reduce the impedance of the first base layer (often by a quantum tunneling mechanism). If the layer is too thick then only a few of the energetic electrons 310 that are generated in the top layer 130 may reach the photoresist layer 110. In various embodiments, the thickness of the low impedance first base layer may be less than or equal to 5 nm, and in one embodiment the thickness of the low impedance first base layer is less than 2 nm.

It is noted that, in this example, the materials used for the DOE are restricted to silicon based dielectrics which may not be absorbing EUV photons efficiently. Thus, the top layer 130 may be the main source of energetic electrons 310 for the electron flux into the photoresist layer 110 from below. Hence, the boost to the electron influx through the second side of the photoresist layer 110 is provided by selecting a low thickness for the low impedance first base layer. As explained further below, the thickness selected for metal-containing materials may not be as thin as the thickness selected for silicon based dielectric materials.

In addition to functioning as an electron booster layer, the base layer 120 may function as a hard mask layer during the etch process used to extend the depth spaces 320 in FIG. 3B to the higher aspect ratio spaces 330 in FIG. 3D. As explained above with reference to FIGS. 3C and 3D, in some embodiments the etch chemistry used to etch the top layer 130 may have relatively low selectivity to photoresist, for example, in embodiments where the top layer 130 comprises an organic material such as SOC. Accordingly, there may be a minimum thickness used in selecting the first thickness of the low impedance first base layer. Otherwise, when used as part of the lithography stack 102, the base layer 120 may fail to function properly as an etch mask. In various embodiments, the thickness of the low impedance first base layer may be from about 0.5 nm to about 5 nm. In some embodiment, the thickness may be greater than or equal to 0.5 nm and less than or equal to 2 nm.

The flow diagram in FIG. 6 illustrates a method 600 of forming an etch mask over a substrate. The method 600 comprises forming a base layer 120, (box 610 and FIG. 3A). The base layer 120 may also be referred to as an electron booster layer as explained above. The electron booster layer may be formed adhering to a major surface of the substrate 100 and a photoresist layer 110 may be formed adhering to a major surface of the electron booster layer (box 620 and FIG. 3B). As indicated in box 614, the adherence of photoresist to the major surface of the electron booster layer may be improved by a surface treatment exposing the major surface of the electron booster layer to a hydrogen containing gas to convert the major surface of the electron booster to be hydrophobic prior to coating the surface with photoresist. As described above, example surface treatment processes include plasma treatment with hydrogen radicals, hydrogen gas anneal, and coating with a hydrocarbon. Another surface modification method is to form a thin coating of a hydrophobic material over the major surface of the base layer 120, for example, a self-assembled monolayer (SAM), the SAM comprising ODS, FAS, AHAPS, or CMPhS, as mentioned above.

The photoresist layer 110 adhering to the electron booster layer may be exposed to a pattern of EUV radiation 300 (see FIG. 3B). A portion of the EUV photon flux may penetrate the photoresist layer 110 and be absorbed in layers below (e.g., the base layer 120 and the top layer 130). The photon absorption process generates an electron flux having the same pattern as the EUV radiation 300. Some of the energetic electrons 310 (see FIG. 3B) emitted below the photoresist may enter the photoresist layer 110 inducing electrochemical reactions that expose some of the unreacted photoresist molecules. Accordingly, while a first portion of the photoresist in the photoresist layer 110 is directly exposed by absorption of EUV radiation in the photoresist (indicated in box 630), a second portion of the photoresist in the photoresist layer 110 is exposed by the electron flux entering the photoresist from below, as indicated in box 634 of the flow diagram of the method 600 for forming an etch mask.

After exposing the photoresist with the pattern of EUV radiation 300 and the electron flux from below the photoresist layer 110, the photoresist may be developed using a suitable developer to form a patterned photoresist etch mask 110, as indicated in box 640 of the flow diagram of the method 600 illustrated in FIG. 6.

The patterned photoresist layer 110 may then be used as a masking layer to transfer the pattern of the EUV radiation 300 to the electron booster layer, as illustrated in FIG. 3C and indicated in box 650 in FIG. 6. As also indicated in box 650, the combined layers of the lithography stack 102 in FIG. 3C (combination of the patterned electron booster layer and the patterned photoresist layer 110 remaining after patterning the electron booster layer) is the example etch mask formed using the method 600 for forming an etch mask over a substrate. An example of the lithography stack 102 being used as the etch mask in a subsequent etch step used to transfer the EUV pattern to the top layer 130 of the substrate 100 is described above with reference to the cross-sectional view illustrated in FIG. 3D.

The electron flux through the second side 304 of the photoresist layer 110 (see FIG. 3B) may be boosted by the electron booster layer (the base layer 120) in two ways: boosting the generation rate of energetic electrons 310 in the electron booster layer and boosting the transport of electrons through the booster layer for energetic electrons 310 generated in the substrate below the electron booster layer, for example, in the top layer 130 of the substrate 100, as illustrated schematically by arrows in FIG. 3B. A different material and thickness may be used for the base layer 120 depending on which of the two ways of enhancing the electron flux are emphasized. As mentioned above with reference to FIGS. 4 and 5, the selection of appropriate material and thickness for the base layer 120 may be done using the method 400.

The electron generation rate in the electron booster layer (the base layer 120) may be increased by introducing atoms having low ionization energy, for example, atoms of many metals. Generally, metal atoms and/or atoms having a high atomic number (high-Z) absorb EUV photons efficiently. Accordingly, in some embodiments, the electron booster layer may be a high-Z/metal-containing layer. The high-Z/metal-containing electron booster layer may be a metallic layer comprising, for example, titanium, titanium nitride, tantalum nitride, aluminum nitride, tungsten, molybdenum, or ruthenium. In some other embodiments, the high-Z/metal-containing electron booster layer may comprise a metal oxide such as aluminum oxide, hafnium oxide, zirconium oxide, titanium oxide, tantalum oxide, manganese oxide, tin oxide, or indium oxide. Since the high-Z/metal-containing electron booster layer is used to boost the supply of energetic electrons 310 from within the base layer 120, a thickness greater than or equal to about 3 nm may be used in which EUV photons may be absorbed efficiently. It is noted, however, that the base layer 120 is a sacrificial layer and excessive thickness is undesirable for a subsequent process step used to strip the layer. In various embodiments, the thickness of the metallic or metal-oxide base layer 120 may be from about 3 nm to about 10 nm. It is further noted that the choice of materials for the base layer 120 may be limited by the patterning level at which the EUV lithography is being performed. For example, in some applications, concerns for metal contamination may preclude using a metal-containing material as the base layer 120 and high-Z/metal-containing electron booster layer may not be an option for a first base layer. However, a silicon based dielectric may be used. Then, as mentioned above, a low-impedance first base layer may be selected to boost the electron flux entering the photoresist layer 110 from the second side 304. As explained above, in this case, the electron flux is boosted by facilitating the transport of energetic electrons 310 arriving from the top layer 130 and passing through the base layer 120 to reach the photoresist layer 110. The transport of electrons through the base layer 120 may be boosted by reducing the thickness to reduce the impedance of the layer to electron current. In some embodiments, the low-impedance base layer 120 may be sufficiently thin such that the quantum tunneling probability for electrons is high. In the direct tunneling regime, the electron flux through a dielectric film may increase exponentially with decreasing film thickness. Generally, direct tunneling becomes the dominant transport mechanism through a dielectric film if the thickness of the dielectric film is reduced to about 2 nm or lower.

Energetic electrons 310 generated in the top layer 130 below the base layer 120 are more likely to reach the photoresist layer 110 through the second side 304 if the thickness of the base layer 120 is reduced. However, as explained above with reference to FIGS. 3C and 3D, in some embodiments, the patterned base layer 120 may be used as a hard mask to etch the top layer 130 of the substrate 100. Inadequate thickness of the electron booster layer may compromise its ability to be an effective etch mask. Furthermore, if the layer is too thin then it may be difficult to form the layer and control the deposition process reliably in manufacturing. In some embodiments, the low-impedance first base layer may be used as the base layer 120. In some embodiments, the low-impedance base layer 120 may be a silicon-based dielectric layer comprising silicon carbide, silicon carbonitride, carbon-doped silicon oxide, silicon oxycarbonitride, or silicon nitride and, the thickness of the low-impedance base layer 120 may be greater than or equal to 0.5 nm and less than or equal to 5 nm and, in one embodiment, less than or equal to 2 nm.

As mentioned above, the embodiments described in this disclosure provide the advantage of lowering the cost of patterning a substrate using EUV lithography. The cost reduction is achieved by methods of forming the lithography stack to pattern the top layer of the incoming substrate with a pattern of EUV radiation. Using the methods described in this disclosure, the lithography stack may be a two-layer lithography stack comprising a base layer formed over the surface of the incoming substrate and a photoresist layer formed over the base layer. The methods for selecting the combination of thickness and composition of the base layer, as described herein, help reduce the EUV radiation dose with negligible adverse impact on pattern quality, thereby increasing throughput and reducing manufacturing cost.

Example embodiments of the invention are summarized here. Other embodiments can also be understood from the entirety of the specification as well as the claims filed herein.

Example 1. A method for fabricating a semiconductor device includes: forming a base layer over a top layer of a substrate, the base layer including a silicon based dielectric having a thickness less than or equal to 5 nm and greater than or equal to 0.5 nm; forming a photoresist layer over the base layer, the photoresist including a first side and an opposite second side; exposing a first portion of the photoresist layer to a pattern of extreme ultraviolet (EUV) radiation from the first side; exposing a second portion of the photoresist layer with a pattern of electron flux from the second side, the electron flux being directed into the photoresist layer from the base layer in response to the EUV radiation; developing the exposed photoresist layer to form a patterned photoresist layer; and transferring the pattern of the patterned photoresist layer to the base layer and the top layer.

Example 2. The method of example 1, where the volume of the second portion is less than the volume of the first portion and more than 10% of the total volume of the photoresist.

Example 3. The method of one of examples 1 or 2, where the silicon based dielectric is silicon carbide, the silicon carbide having a carbon content greater than or equal to 40 atomic % and less than or equal to 50 atomic %.

Example 4. The method of one of examples 1 to 3, where the silicon based dielectric is silicon carbonitride, the silicon carbonitride having a carbon content greater than or equal to 10 atomic % and less than or equal to 30 atomic %.

Example 5. The method of one of examples 1 to 4, where the silicon based dielectric is silicon oxycarbonitride, the silicon oxycarbonitride having a carbon content greater than or equal to 10 atomic % and less than or equal to 30 atomic %.

Example 6. The method of one of examples 1 to 5, where forming the base layer further includes: before forming the photoresist layer, modifying a major surface of the base layer resulting in the major surface being hydrophobic.

Example 7. The method of one of examples 1 to 6, where modifying the major surface of the base layer includes exposing the major surface to hydrogen radicals (H*), depositing a hydrocarbon (CHx) coating over the major surface, or annealing the substrate in an ambient including hydrogen gas.

Example 8. The method of one of examples 1 to 7, where modifying the major surface of the base layer includes forming a coating of a self-assembled monolayer (SAM) over the major surface, the SAM including n-octadecyltrimethoxysilane (ODS: $H_3C(CH_2)_{17}Si(OCH_3)_3$), heptadecafluoro-1,1,2,2-tetrahydro-decyl-1-trimethoxysilane (FAS: $F_3C(CF_2)_7(CH_2)_2Si(OCH_3)_3$), n-(6-aminohexyl)aminopropyltrimethoxysilane (AHAPS: $H_2N(CH_2)_6NH(CH_2)_3Si(OCH_3)_3$, and 4-(chloromethyl)phenyltrimethoxysilane (CMPhS: $H_2ClC(C_6H_4)Si(OCH_3)_3$).

Example 9. The method of one of examples 1 to 8, where forming the base layer includes performing an atomic layer deposition (ALD) process that includes exposing the top layer of the substrate to a gas mixture including water vapor.

Example 10. The method of one of examples 1 to 9, where forming the base layer includes performing a cyclic chemical vapor deposition (CVD) process that includes exposing the substrate to a low temperature oxide precursor for SiOC(N).

Example 11. The method of one of examples 1 to 10, where the top layer includes a spin-on carbon (SOC) layer, an organic dielectric layer (ODL), an amorphous carbon (a-C) layer, or an organic planarization layer (OPL).

Example 12. A method for forming an etch mask over a substrate, the method includes: forming an electron booster layer adhering to a major surface of the substrate; exposing the major surface of the electron booster layer to a hydrogen-containing gas to convert the major surface be hydrophobic; forming a photoresist layer adhering to the hydrophobic major surface of the electron booster layer; exposing a first portion of the photoresist layer with a pattern of extreme ultraviolet (EUV) radiation; exposing a second portion of the photoresist layer with electron flux directed from the electron booster layer, where a portion of the EUV radiation is absorbed below the photoresist layer to generate the electron flux; developing the exposed photoresist layer to form a patterned photoresist layer; and patterning the electron booster layer with the patterned photoresist layer to form a patterned electron booster layer, the etch mask being the combined patterned electron booster layer and the patterned photoresist layer remaining after patterning the electron booster layer.

Example 13. The method of example 12, where forming the electron booster layer includes forming a metallic layer, the metallic layer including titanium, titanium nitride, tantalum nitride, aluminum nitride, tungsten, molybdenum, or ruthenium.

Example 14. The method of one of examples 12 or 13, where the forming an electron booster layer includes forming a layer including a metal oxide, where the metal oxide includes aluminum oxide, hafnium oxide, zirconium oxide, titanium oxide, tantalum oxide, manganese oxide, tin oxide, or indium oxide.

Example 15. The method of one of examples 12 to 14, where the forming an electron booster layer includes forming a silicon-based dielectric layer including silicon carbide, silicon carbonitride, carbon-doped silicon oxide, silicon oxycarbonitride, or silicon nitride and, where the thickness of the silicon-based dielectric layer is greater than or equal to 0.5 nm and less than or equal to 5 nm.

Example 16. A method for patterning a substrate includes: preparing a plurality of test substrates, where each test substrates has a substantially same top layer; forming a lithography stack over the top layer of each of the plurality of test substrates, the lithography stack including a base layer and a photoresist layer disposed over the base layer, where the base layer in each of the plurality of test substrates has a different combination of thickness and composition; patterning each photoresist layer with an extreme ultraviolet (EUV) lithography process, by exposing the photoresist layer to a pattern of EUV radiation in a focus-exposure matrix; obtaining patterning metrics by measuring the patterned photoresist layer of each of the plurality of test substrates; and based on the patterning metrics, selecting a first type of base layer, the first type of base layer having a specific combination of a first thickness and a first composition for forming a first base layer of a lithography stack for an EUV lithography process.

Example 17. The method of example 16, where the patterning metrics include depth-of-focus, critical dimension, edge placement error, line edge roughness, line width roughness, photoresist sidewall angle, or defect density in the photoresist pattern, or a combination thereof.

Example 18. The method of one of examples 16 or 17, where selecting the first type of base layer includes: for each patterning metric, defining a range in which the metric would be acceptable; for each patterning metric, obtaining a relationship between exposure dose and the patterning metric for each base layer; based on the relationships, identifying the base layers for which there is an exposure dose at which each of the patterning metrics is within the respective range; and from the identified base layers, selecting the first type of base layer.

Example 19. The method of one of examples 16 to 18, where the composition of each of the base layers includes a composition of silicon (Si), oxygen (O), carbon (C), and nitrogen (N) atoms, where the molar fraction of Si and the molar fraction of at least one of O, C, and N is greater than or equal to 10 atomic %.

Example 20. The method of one of examples 16 to 19, where the molar fraction of carbon is greater than or equal to 10 atomic % and less than or equal to 50 atomic %.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a semiconductor device comprising:
    forming a base layer over a top layer of a substrate, the base layer comprising a silicon based dielectric having a thickness less than or equal to 5 nm and greater than or equal to 0.5 nm;
    forming a photoresist layer over the base layer, the photoresist comprising a first side and an opposite second side;
    exposing a first portion of the photoresist layer to a pattern of extreme ultraviolet (EUV) radiation from the first side;
    exposing a second portion of the photoresist layer with a pattern of electron flux from the second side, the electron flux being directed into the photoresist layer from the base layer in response to the EUV radiation;
    developing the exposed photoresist layer to form a patterned photoresist layer; and
    transferring the pattern of the patterned photoresist layer to the base layer and the top layer.

2. The method of claim 1, wherein the volume of the second portion is less than the volume of the first portion and more than 10% of the total volume of the photoresist.

3. The method of claim 1, wherein the silicon based dielectric is silicon carbide, the silicon carbide having a carbon content greater than or equal to 40 atomic % and less than or equal to 50 atomic %.

4. The method of claim 1, wherein the silicon based dielectric is silicon carbonitride, the silicon carbonitride having a carbon content greater than or equal to 10 atomic % and less than or equal to 30 atomic %.

5. The method of claim 1, wherein the silicon based dielectric is silicon oxycarbonitride, the silicon oxycarbonitride having a carbon content greater than or equal to 10 atomic % and less than or equal to 30 atomic %.

6. The method of claim 1, wherein forming the base layer further comprises:
before forming the photoresist layer, modifying a major surface of the base layer resulting in the major surface being hydrophobic.

7. The method of claim 6, wherein modifying the major surface of the base layer comprises exposing the major surface to hydrogen radicals (H*), depositing a hydrocarbon ($CH_x$) coating over the major surface, or annealing the substrate in an ambient comprising hydrogen gas.

8. The method of claim 6, wherein modifying the major surface of the base layer comprises forming a coating of a self-assembled monolayer (SAM) over the major surface, the SAM comprising n-octadecyltrimethoxysilane (ODS: $H_3C(CH_2)17Si(OCH_3)_3$), heptadecafluoro-1,1,2,2-tetrahydro-decyl-1-trimethoxysilane (FAS: $F_3C(CF_2)_7(CH_2)2Si(OCH_3)_3$), n-(6-aminohexyl)aminopropyltrimethoxysilane (AHAPS: $H_2N(CH_2)6NH(CH_2)3Si(OCH_3)_3$, and 4-(chloromethyl)phenyltrimethoxysilane (CMPhS: $H_2ClC(C_6H_4)Si(OCH_3)_3$).

9. The method of claim 1, wherein forming the base layer comprises performing an atomic layer deposition (ALD) process that comprises exposing the top layer of the substrate to a gas mixture comprising water vapor.

10. The method of claim 1, wherein forming the base layer comprises performing a cyclic chemical vapor deposition (CVD) process that comprises exposing the substrate to a low temperature oxide precursor for SiOC(N).

11. The method of claim 1, wherein the top layer comprises a spin-on carbon (SOC) layer, an organic dielectric layer (ODL), an amorphous carbon (a-C) layer, or an organic planarization layer (OPL).

12. A method for forming an etch mask over a substrate, the method comprising:
forming an electron booster layer adhering to a major surface of the substrate;
exposing the major surface of the electron booster layer to a hydrogen-containing gas to convert the major surface be hydrophobic;
forming a photoresist layer adhering to the hydrophobic major surface of the electron booster layer;
exposing a first portion of the photoresist layer with a pattern of extreme ultraviolet (EUV) radiation;
exposing a second portion of the photoresist layer with electron flux directed from the electron booster layer, wherein a portion of the EUV radiation is absorbed below the photoresist layer to generate the electron flux;
developing the exposed photoresist layer to form a patterned photoresist layer; and
patterning the electron booster layer with the patterned photoresist layer to form a patterned electron booster layer, the etch mask being the combined patterned electron booster layer and the patterned photoresist layer remaining after patterning the electron booster layer.

13. The method of claim 12, wherein forming the electron booster layer comprises forming a metallic layer, the metallic layer comprising titanium, titanium nitride, tantalum nitride, aluminum nitride, tungsten, molybdenum, or ruthenium.

14. The method of claim 12, wherein the forming an electron booster layer comprises forming a layer comprising a metal oxide, wherein the metal oxide comprises aluminum oxide, hafnium oxide, zirconium oxide, titanium oxide, tantalum oxide, manganese oxide, tin oxide, or indium oxide.

15. The method of claim 12, wherein the forming an electron booster layer comprises forming a silicon-based dielectric layer comprising silicon carbide, silicon carbonitride, carbon-doped silicon oxide, silicon oxycarbonitride, or silicon nitride and, wherein the thickness of the silicon-based dielectric layer is greater than or equal to 0.5 nm and less than or equal to 5 nm.

16. A method for patterning a substrate comprising:
preparing a plurality of test substrates, wherein each test substrates has a substantially same top layer;
forming a lithography stack over the top layer of each of the plurality of test substrates, the lithography stack comprising a base layer and a photoresist layer disposed over the base layer, wherein the base layer in each of the plurality of test substrates has a different combination of thickness and composition;
patterning each photoresist layer with an extreme ultraviolet (EUV) lithography process, by exposing the photoresist layer to a pattern of EUV radiation in a focus-exposure matrix;
obtaining patterning metrics by measuring the patterned photoresist layer of each of the plurality of test substrates; and
based on the patterning metrics, selecting a first type of base layer, the first type of base layer having a specific combination of a first thickness and a first composition for forming a first base layer of a lithography stack for an EUV lithography process.

17. The method of claim 16, wherein the patterning metrics comprise depth-of-focus, critical dimension, edge placement error, line edge roughness, line width roughness, photoresist sidewall angle, or defect density in the photoresist pattern, or a combination thereof.

18. The method of claim 16, wherein selecting the first type of base layer comprises:
for each patterning metric, defining a range in which the metric would be acceptable;
for each patterning metric, obtaining a relationship between exposure dose and the patterning metric for each base layer;
based on the relationships, identifying the base layers for which there is an exposure dose at which each of the patterning metrics is within the respective range; and
from the identified base layers, selecting the first type of base layer.

19. The method of claim 16, wherein the composition of each of the base layers comprises a composition of silicon (Si), oxygen (O), carbon (C), and nitrogen (N) atoms, wherein the molar fraction of Si and the molar fraction of at least one of O, C, and N is greater than or equal to 10 atomic %.

20. The method of claim 19, wherein the molar fraction of carbon is greater than or equal to 10 atomic % and less than or equal to 50 atomic %.

* * * * *